US009318044B2

(12) United States Patent
Su et al.

(10) Patent No.: US 9,318,044 B2
(45) Date of Patent: Apr. 19, 2016

(54) DRIVING CIRCUIT AND RELATED DISPLAY

(71) Applicant: Sitronix Technology Corp., Hsinchu County (TW)

(72) Inventors: Chung-Hsin Su, Hsinchu County (TW); Tsun-Sen Lin, Hsinchu County (TW)

(73) Assignee: Sitronix Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 14/884,776

(22) Filed: Oct. 16, 2015

(65) Prior Publication Data

US 2016/0035269 A1 Feb. 4, 2016

Related U.S. Application Data

(62) Division of application No. 14/135,597, filed on Dec. 20, 2013, now Pat. No. 9,202,428.

(30) Foreign Application Priority Data

Oct. 30, 2013 (TW) ............................ 102139382 A

(51) Int. Cl.

| | |
|---|---|
| ***G09G 3/36*** | (2006.01) |
| ***G09G 3/20*** | (2006.01) |
| ***G11C 11/406*** | (2006.01) |
| ***G09G 5/18*** | (2006.01) |
| ***G09G 5/397*** | (2006.01) |

(52) U.S. Cl.

CPC ............ *G09G 3/2092* (2013.01); *G09G 3/3674* (2013.01); *G09G 5/18* (2013.01); *G09G 5/397* (2013.01); *G11C 11/406* (2013.01); *G09G 2320/0252* (2013.01); *G09G 2330/021* (2013.01)

(58) Field of Classification Search

CPC ............ G09G 3/36; G09G 5/00; G09G 5/18; G06F 3/038; G11C 29/38; G11C 7/00
USPC ............................ 345/99, 213, 215, 222, 100
See application file for complete search history.

(56) References Cited

U.S. PATENT DOCUMENTS

| | | | | |
|---|---|---|---|---|
| 6,281,870 B1 * | 8/2001 | Hayashi | G09G 3/3688 | 345/100 |
| 6,801,219 B2 * | 10/2004 | Colavin | G09G 5/346 | 345/545 |
| 7,551,155 B2 * | 6/2009 | Fukuda | G09G 3/20 | 345/684 |
| 2002/0093472 A1 | 7/2002 | Numao | | |
| 2008/0218438 A1 * | 9/2008 | Aral | G02B 26/0833 | 345/55 |
| 2009/0051712 A1 * | 2/2009 | Arai | G02B 26/0841 | 345/690 |

FOREIGN PATENT DOCUMENTS

CN 1674067 A 9/2005

* cited by examiner

*Primary Examiner* — Pegeman Karimi
(74) *Attorney, Agent, or Firm* — Winston Hsu; Scott Margo

(57) ABSTRACT

A driving circuit for a display includes a logic unit and a memory array coupled to the logic unit for turning on a plurality of memory cells corresponding to the word-line according to a word-line scanning signal to refresh the plurality of memory cells corresponding to the word-line; wherein the memory array has a first number of bit-lines and a second number of word-lines, wherein the driving circuit is used for driving a display panel having a third number of data-lines and a fourth number of scan-lines, and a product of the first number and the second number is equal to a product of the third number and the fourth number.

6 Claims, 7 Drawing Sheets

B_1 B_2 .... B_P
30
1_1 1_2 1_Z W_1
2_1 2_2 2_Z W_2
Z_1 Z_2 Z_Z W_Q 32
1_Z 2_Z Z_Z G_M
1_2 2_2 Z_2 G_2
1_1 2_1 Z_1 G_1
S_1 S_2 .... S_N

20

DRIVING CIRCUIT AND RELATED DISPLAY

CROSS REFERENCE TO RELATED APPLICATIONS

This application is a division application of U.S. patent application Ser. No. 14/135,597, filed on Dec. 20, 2013, the contents of which are hereby incorporated by reference in their entirety.

BACKGROUND OF THE INVENTION

1. Field of the Invention

The present invention relates to a driving circuit and related display, and more particularly, to a driving circuit and related display capable of following a timing of reading a memory array by a display panel to refresh a memory array.

2. Description of the Prior Art

A liquid crystal display (LCD) is a slim and light-weight flat display having advantages of low radiation and low power consumption, making it suitable to be widely used in electronic products such as laptop computers, personal digital assistants, flat televisions and mobile phones. Different types of LCD include thin film transistor (TFT) LCDs, low temperature poly silicon (LTPS) LCDs and organic light emitting diode (OLED) LCDs.

A flat display may first store received image data in a built-in storage, then utilize a driving circuit to read the image data from the built-in storage and drive a panel of the flat display to display the image data. The built-in storage for the flat display may be a static random access memory (SRAM) or a dynamic random access memory (DRAM). Comparing the SRAM with the DRAM, the DRAM has a higher storing capacity per unit area but requires routine and periodical refresh operations to maintain storing data, even in static images. The driving circuit therefore requires a refresh controller to perform the routine refresh operations in order to maintain the data stored in the DRAM, which makes a design of the driving circuit more complicated. The refresh operations of the refresh controller and read operations of the driving circuit are performed independently, which also results in high power consumption of the flat display.

It has become a topic in the industry to design a method of refreshing a memory and driving circuit thereof to simplify the design of the driving circuit of the display.

SUMMARY OF THE INVENTION

It is therefore an objective of the present invention to provide a driving circuit and display capable of synchronously refreshing the memory array immediately after the display panel has read image data stored in the memory array, in order to simplify a design of the driving circuit.

The present invention discloses a driving circuit for a display, comprising a logic unit for generating a word-line scanning signal corresponding to a word-line, and a memory array coupled to the logic unit for turning on a plurality of memory cells corresponding to the word-line according to the word-line scanning signal to refresh the plurality of memory cells corresponding to the word-line, wherein the memory array has a first number of bit-lines and a second number of word-lines.

The present invention further discloses a display, comprising a display panel, and a driving circuit coupled to the display panel for driving the display panel, wherein the driving circuit comprises a logic unit for generating a word-line scanning signal corresponding to a word-line, and a memory array coupled to the logic unit for turning on a plurality of memory cells corresponding to the word-line according to the word-line scanning signal to refresh the plurality of memory cells corresponding to the word-line, wherein the memory array has a first number of bit-lines and a second number of word-lines.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
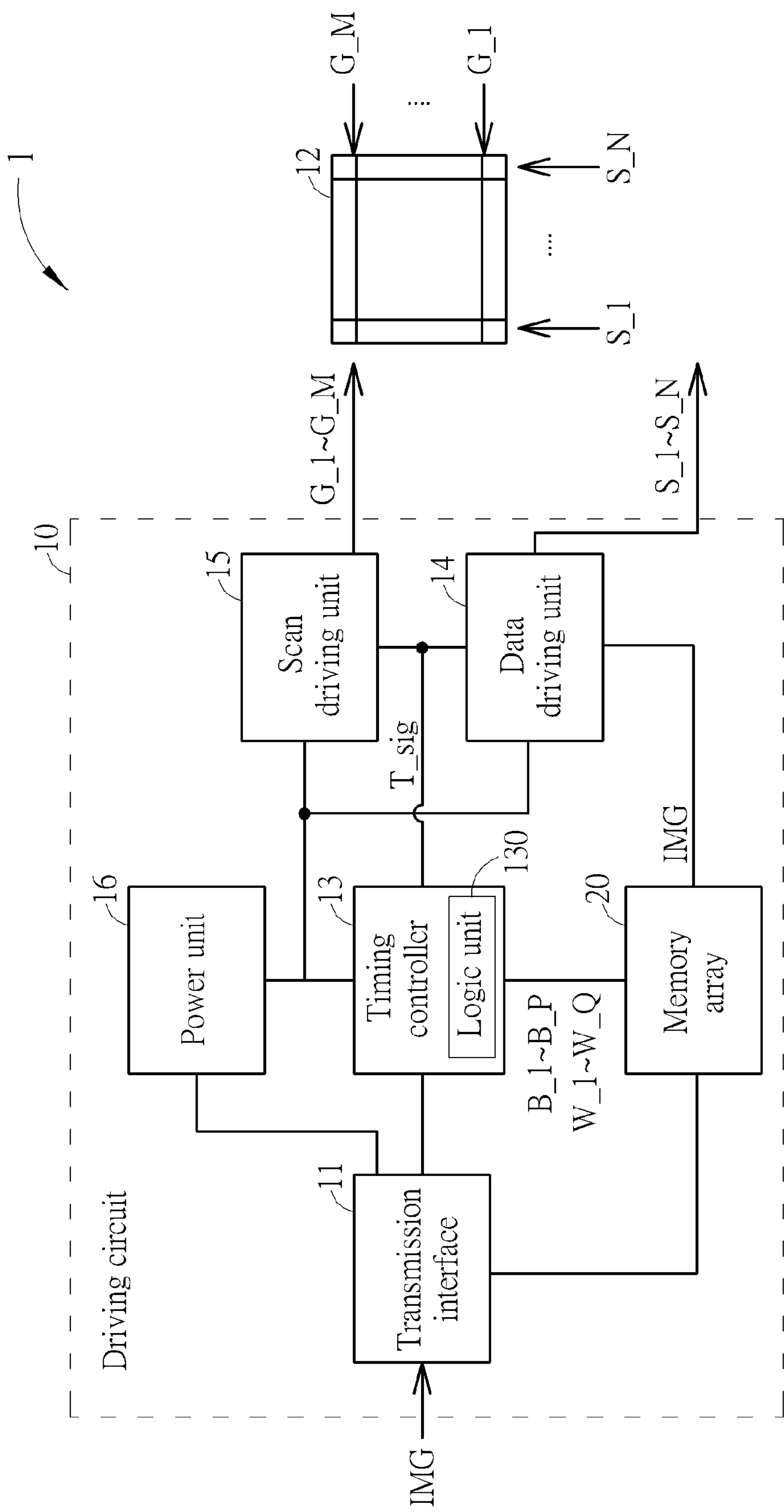
FIG. 1 is a functional block diagram of a display according to an embodiment of the present invention.

Please refer to FIG. 1, which is a functional block diagram of a display 1 according to an embodiment of the present invention. The display 1 includes a driving circuit 10 and a display panel 12. The driving circuit 10 is coupled to the display panel 12 for receiving an image data IMG to generate scan driving signals G_1-G_M and data driving signals S_1-S_N to the display panel 12, such that the display panel 12 is driven by the driving circuit 10 to display the image data IMG. The driving circuit 10 includes a transmission interface 11, a timing controller 13, a data driving unit 14, a scan driving unit 15, a power unit 16 and a memory array 20.

A structure of the driving circuit 10 is shown in FIG. 1. The timing controller 13 generates a timing signal T_sig to the data driving unit 14 and the scan driving unit 15 according to the image data IMG. The data driving unit 14 regularly reads the image data IMG stored in the memory array 20 according to the timing signal T_sig to generate the data driving signals S_1-S_N. The scan driving unit 15 generates the scan driving signals G_1-G_M according to the timing signal T_sig. Under co-operation between the data driving unit 14 and the scan driving unit 15, the driving circuit 10 may drive the display panel 12 to orderly display the image data IMG. For example, when the scan driving unit 15 outputs the scan driving signal G_1, the data driving unit 14 orderly outputs the data driving signals S_1-S_N to drive display cells corresponding to a first raw of the display panel 12, such that the display panel 12 displays the image data IMG corresponding to the first row. When the scan driving unit 15 orderly outputs the scan driving signals from G_1 to G_M, the scan driving unit 15 orderly drives each of the display cells of the display panel 12 to display a completed image data IMG for a single frame. The scan driving unit 15 then orderly outputs the scan driving signals G_1-G_M once more according to timing signal T_sig to display the image data IMG for the next frame.

As can be seen, operations of the data driving unit 14 and the scan driving unit 15 are controlled based on the timing signal T_sig, such that all the display cells of the display panel 12 are orderly driven and scanned. For a memory array requiring periodical refresh operations, all the memory cells in the memory array also need to be orderly driven and scanned to maintain storing data. Accordingly, the present invention utilizes an operation of the display panel 12 to synchronously perform the refresh operations of the memory array 20 immediately after the display panel 12 has read the image data IMG, so as to maintain the data stored in the memory array 20.

Specifically, the timing controller 13 includes a logic unit 130 for generating bit-line scanning signals B_1-B_P and word-line scanning signals W_1-W_Q to the memory array 20 according to timing signal T_sig, such that the data driving unit 14 may rewrite the image data IMG into the memory cells of the memory array 20 immediately after the image data IMG is read from the memory array 20. In contrast to a traditional memory array (i.e. the built-in memory) which requires the refresh controller for the periodical refresh operations, the present invention may exclude the refresh controller from the driving circuit since the refresh operations for the memory array are performed immediately after the read operations and following a timing based on the timing signal of the timing controller. This simplifies a circuit design of the driving circuit as well as reducing production costs.

Figure 2:
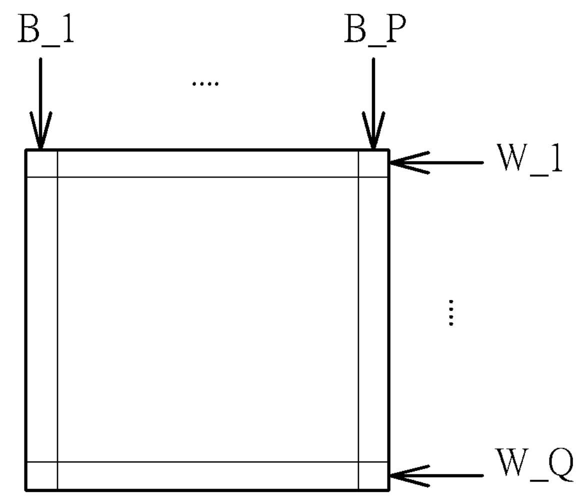
FIG. 2 illustrates a memory cell configuration of the memory array shown in FIG. 1 according to an embodiment of the present invention.

Please refer to FIG. 2, which illustrates a memory cell configuration of the memory array 20 according to an embodiment of the present invention. The memory array 20 includes a plurality of memory cells for storing the image data IMG which are turned on according to the bit-line scanning signal B_1-B_P and the word-line scanning signal W_1-W_Q, which allows the data driving unit 14 to read and refresh the image data IMG of the memory cells. The memory array 20 may be any kind of random access memory utilized in a flat display and requiring the periodical refresh operations, such as a DRAM or a pseudo static random access memory (PSRAM).

Figure 3:
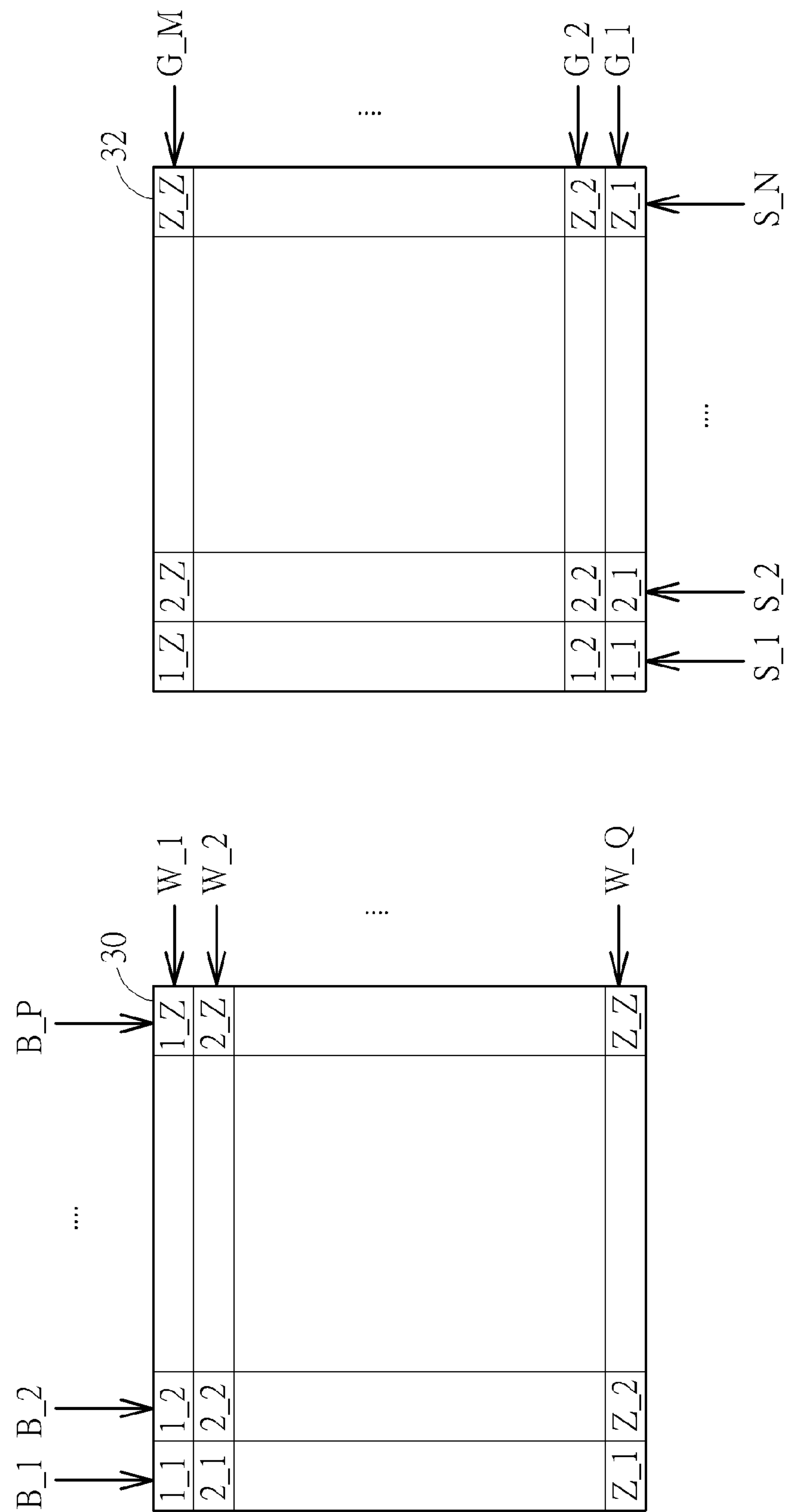
FIG. 3 illustrates a first embodiment of the present invention including a memory cell configuration of a memory array and a display cell configuration of a display panel.

Please refer to FIG. 3, which illustrates a first embodiment of the present invention including a memory cell configuration of a memory array 30 and a display cell configuration of a display panel 32. The memory array 30 functions in the same way as the memory array 20 shown in FIG. 2, while the display panel 32 functions in the same way as the display panel 12 shown in FIG. 1. In FIG. 3, the memory cells and the display cells, which are respectively for storing and displaying the same image data IMG, are denoted with the same symbols, e.g. 1_1-1_Z, 2_1-2_Z, . . . , and Z_1-Z_Z. The memory array 30 has a number of word-lines Q and a number of bit-lines P, and the display panel 32 has a number of data-lines N and a number of scan-lines M.

In the first embodiment, it is assumed that the display cells 1_1-Z_1 in a first row of the display panel 32 are mapped to the memory cells 1_1-Z_1 corresponding to a first bit-line in a first column of the memory array 30, and so forth, and that the display cells Z_1-Z_Z in a $Z^{th}$ row of the display panel 32 are mapped to the memory cells Z_1-Z_Z corresponding to a $Z^{th}$ bit-line in a $Z^{th}$ column of the memory array 30. The display panel 32 may scan the display cells from a top row to a bottom row or from the bottom row to the top row, i.e. the $M^{th}$ row of the display panel 32 may be the top or bottom row for different cases.

When the display panel 32 is to display the image data IMG corresponding to the display cell 1_1 in the first row, the logic unit 130 generates the bit-line scanning signal B_1 corresponding to the first bit-line in the first column and the word-line scanning signal W_1 corresponding to the first word-line in the first row according to the timing signal T_sig. The memory array 30 then turns on the memory cells 1_1-1_Z corresponding to the first word-line in the first row according to word-line scanning signal W_1, and the memory array 30 reads the image data IMG stored in the memory cell 1_1 according to the bit-line scanning signal B_1 in order to output it to the data driving unit 14. Finally, the memory array 30 refreshes the memory cells 1_1-1_Z corresponding to the first word-line in the first row according to the word-line scanning signal W_1, so as to maintain the data stored in the memory cells 1_1-1_Z.

Likewise, when the display panel 32 is to display the image data IMG corresponding to the display cell 2_1 in the first row, the memory array 30 orderly refreshes the memory cells 2_1-2_Z corresponding to the word-line in the second row to maintain the data stored in the memory cells 2_1-2_Z. As a result, each of the memory cells 1_1-1_Z, 2_1-2_Z, . . . , Z_1-Z_Z in the memory array 30 are refreshed once after the display panel 32 displays the image data IMG corresponding to the display cells 1_1-Z_1 in the first row of the display panel 32. Each of the memory cells of the memory array 30 is refreshed again after the display panel 32 displays the image data IMG corresponding to the display cells 1_2-Z_2 in the second row of the display panel 32.

Following the timing of the timing signal T_sig, as soon as the data driving unit 14 outputs the data driving signal S_1, S_2, . . . , or S_N, the logic unit 130 correspondingly generates the word-line scanning signal W_1, W_2, . . . , or W_Q for refreshing the memory cells connected at a same word-line. Alternatively, every time that the scan driving unit 15 outputs the scan driving signal G_1, G_2, . . . , or G_M, the memory array 30 performs data refreshing once. Therefore, the memory array 30 of the present invention follows the operating timing of the display panel 32 to refresh the memory cells immediately after the display panel 32 reads the image data IMG, such that the refresh controller is unnecessary for the memory array 30. This simplifies the circuit design and reduces the cost of the driving circuit 10.

Noticeably, a memory cell in a memory array is traditionally turned on twice for read and write operations, respectively. A word-line scanning signal for turning on the memory cell must therefore be outputted twice, which leads to higher power consumption of the flat display. The word-line scanning signals W_1-W_Q of the present invention, however, are outputted once for both the read and the following write operations, which saves power consumption of the flat display.

Reading the memory cell 1_1 is taken as an example. The word-line scanning signal W_1 is used for turning on the memory cells 1_1-1_Z corresponding to the first word-line in the first row of the memory array 30, and the bit-line scanning signal B_1 is used for reading or selecting the specific memory cell 1_1 from the first row to output the storing image data IMG to the data driving unit 14. Since the memory cells 1_1-1_Z corresponding to the first word-line in the first row are turned on, the memory array 30 refreshes the memory cells 1_1-1_Z immediately after the read operation. As a result, the present invention continuously performs the write operation immediately after the read operation when the word-line scanning signal W_1 is being output, in order to save power consumption.

Please note that sizes of the memory array 30 and the display panel 32 preferably obey the following formulas (1) and (2), such that the memory array 30 is able to follow the timing and the scanning order of the display panel 32 for the refresh operation. Formulas (1) and (2) are denoted as follows:

$$Q=K*N \quad (1)$$

$$M*N=P*Q \quad (2)$$

Wherein, Q is a number of word-lines in each column of the memory array 30, P is a number of bit-lines in each row of the memory array 30, N is a number of data-lines in each row of the display panel 32 and M is a number of scan-lines in each column of the display panel 32, and K is a ratio of Q and N. In addition, the number P may be denoted as M/K.

According to formula (1), the memory array 30 may refresh the memory cells connected to Q word-lines after the display panel 32 has scanned N data-lines multiplied by K rows, i.e. all the memory cells in the memory array 30 are refreshed. The ratio K is equal to 1 in the first embodiment, which indicates that all the memory cells of the memory array 30 are refreshed one time after the display panel 32 has scanned N data-lines in the first row. According to formula (2), the memory array 30 and the display panel 32 have a same area, thereby each of the memory cells of the memory array 30 may respectively be mapped or correspond to each of the display cells of the display panel 32.

In addition, a refresh rate R_rate of the memory array 30, i.e. a number that the memory array 30 is refreshed per second, may be derived from formulas (1) and (2). The refresh rate R_rate is denoted by the following formula (3):

$$R\_rate=H*P \quad (3)$$

Wherein, H is a frame rate of the display panel 32 and P is a number of bit-lines in each row of the memory array 30. According to formula (3), the display panel 32 scans H times per second, and the memory array 30 refreshes P times when the display panel 32 scans one time. The ratio K is equal to 1 in the first embodiment, which means that each of the memory cells of the memory array 30 are refreshed P times when the display panel 32 scans one time.

Practical data is taken as an example. The first embodiment assumes that the display panel 32 is a QVGA type display panel having a resolution of 240*320, a frame rate of 60 Hertzs, and 320 scan-lines, i.e. M=320. Deriving from formulas (1) and (2) and the ratio K being 1, the bit-line number P should be 320. Putting the refresh rate H=60 into formula (3), the refresh rate R_rate of the QVGA display panel should be 60*320=19200 per second, i.e. per 52 micro seconds the QVGA display panel is refreshed once.

Figure 4:
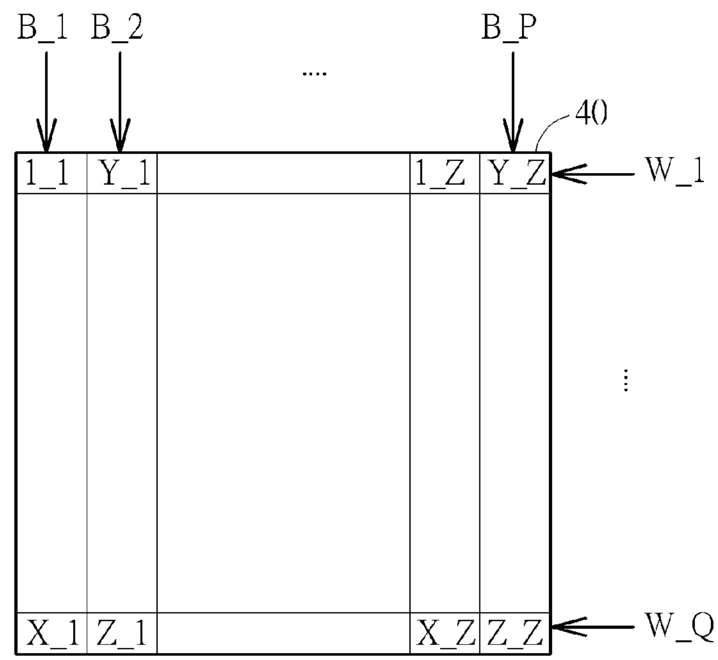
FIG. 4 illustrates a second embodiment of the present invention including a memory cell configuration of a memory array and a display cell configuration of a display panel.
Figure 4:
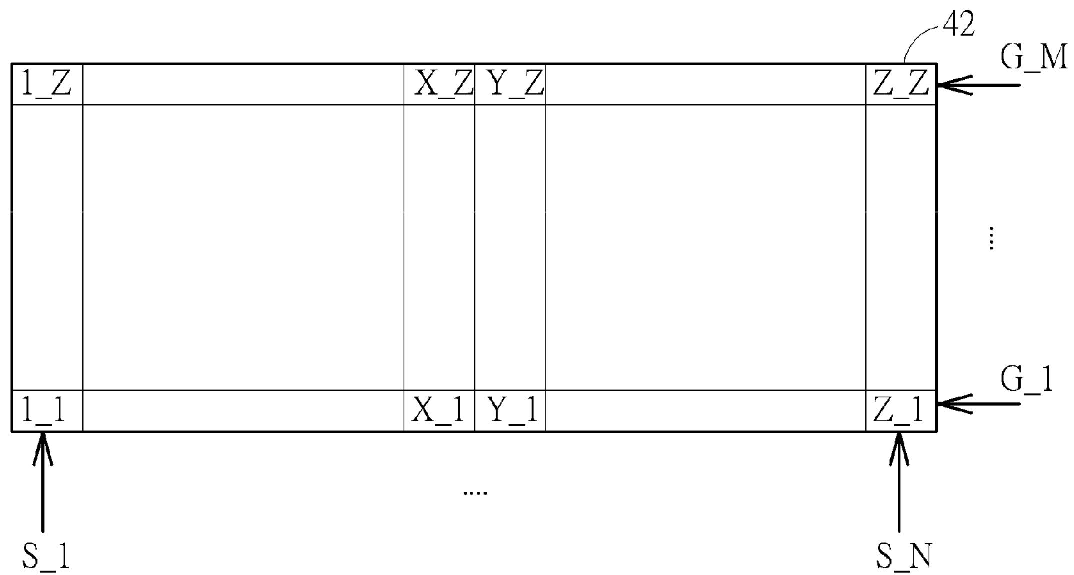

Please refer to FIG. 4, which illustrates a second embodiment of the present invention including a memory cell configuration of a memory array 40 and a display cell configuration of a display panel 42. A number N of data-lines of the display panel 42 equals twice the number Q of word-lines of the memory array 40, i.e. Q=N/2, thereby the ratio K is ½. In such a condition, each of the memory cells 1_1, Y_1-1_Z, Y_Z, . . . , X_1, Z_1-X_Z, Z_Z in the memory array 40 is refreshed twice after the display panel 42 displays the image data IMG of the display cells 1_1-X_1, Y_1-Z_1 in the first row of the display panel 42.

The QVGA display panel having a resolution 240*320 and a refresh rate of 60 Hertzs is taken as an example. The number M of scan-lines being 320, the refresh rate H=60 and the ratio K=½ are put into formulas (1), (2) and (3). The number of bit-lines P is 2*320 and the refresh rate R_rate of the QVGA display panel 42 shown in FIG. 4 is 60*2*320=38400 per second, i.e. per 26 micro seconds the QVGA display panel is refreshed once.

Figure 5:
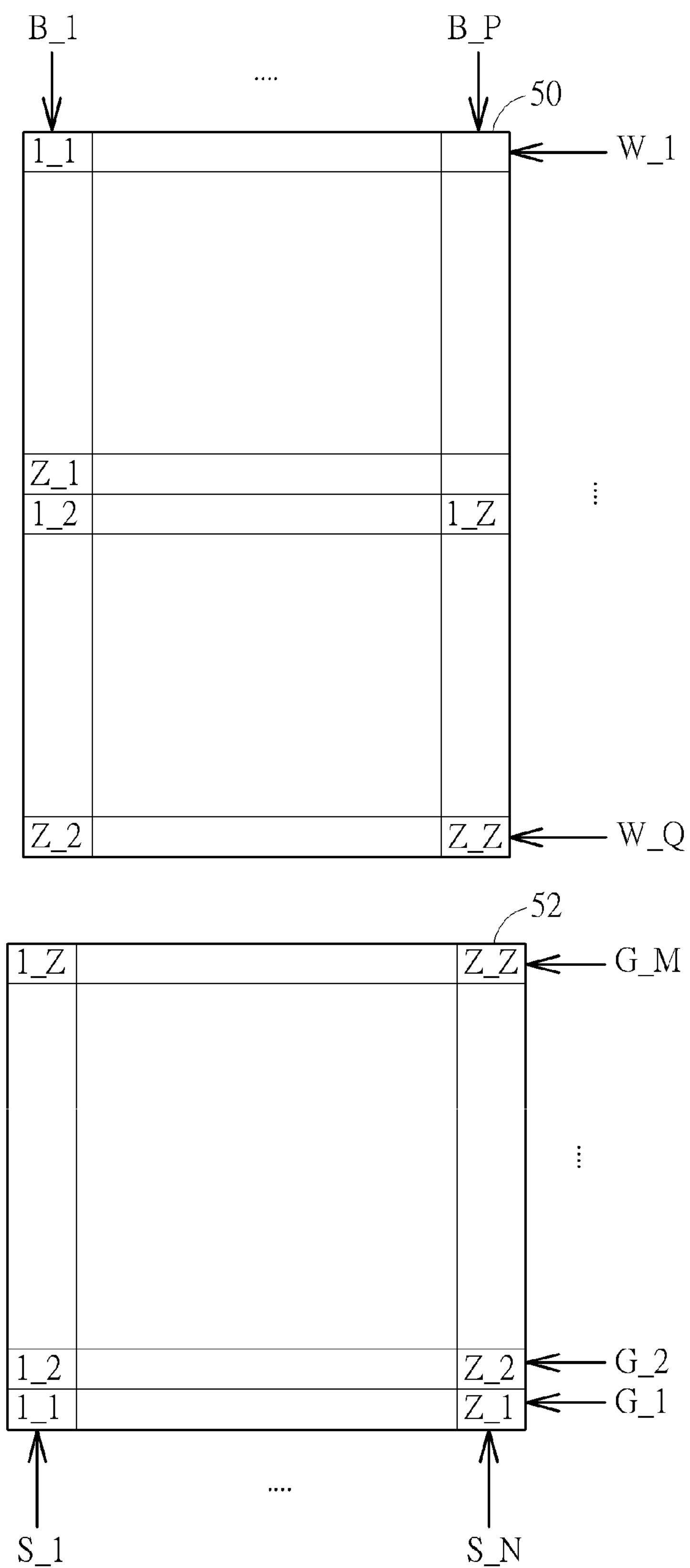
FIG. 5 illustrates a third embodiment of the present invention including a memory cell configuration of a memory array and a display cell configuration of a display panel.

Please refer to FIG. 5, which illustrates a third embodiment of the present invention including a memory cell configuration of a memory array 50 and a display cell configuration of a display panel 52. Twice the number of data-lines N of the display panel 52 is equal to a number of word-lines Q of the memory array 50, i.e. Q=2*N, thereby the ratio K=2. In such a condition, each of the memory cells 1_1-Z_1, 1_2-Z_2, . . . , 1_Z-Z_Z in the memory array 50 is refreshed one time after the display panel 52 displays the image data IMG of the display cells 1_1-Z_1 and 1_2-Z_2 in the first and second rows of the display panel 52.

The QVGA display panel having a resolution 240*320 and a refresh rate of 60 Hertzs is taken as an example. The number of scan-lines M being 320, the refresh rate H=60 and the ratio K=2 are put into formulas (1), (2) and (3). The bit-line number P is 320/2 and the refresh rate R_rate of QVGA display panel 52 shown in FIG. 5 is 60*320/2=9600 per second, i.e. per 104 micro seconds the QVGA display panel is refreshed once.

Noticeably, the first to third embodiments have distinct ratios K, which is associated with the refresh rate of the memory array and capacitances of the memory cells. Specifically, the greater the capacitance of the memory cell, the longer the time that data of the memory cell can be maintained, which means that the refresh rate of the memory array can be slower. The smaller the capacitance of the memory cell, the shorter the time that data of the memory cell can be maintained, which means that the refresh rate of the memory array should be faster to ensure data intactness. A designer may adjust the ratio K, which may be regarded as adjusting an area ratio of a length and a width of the memory array, to adjust the refresh rate of the memory array in order to ensure the data intactness.

Figure 6:
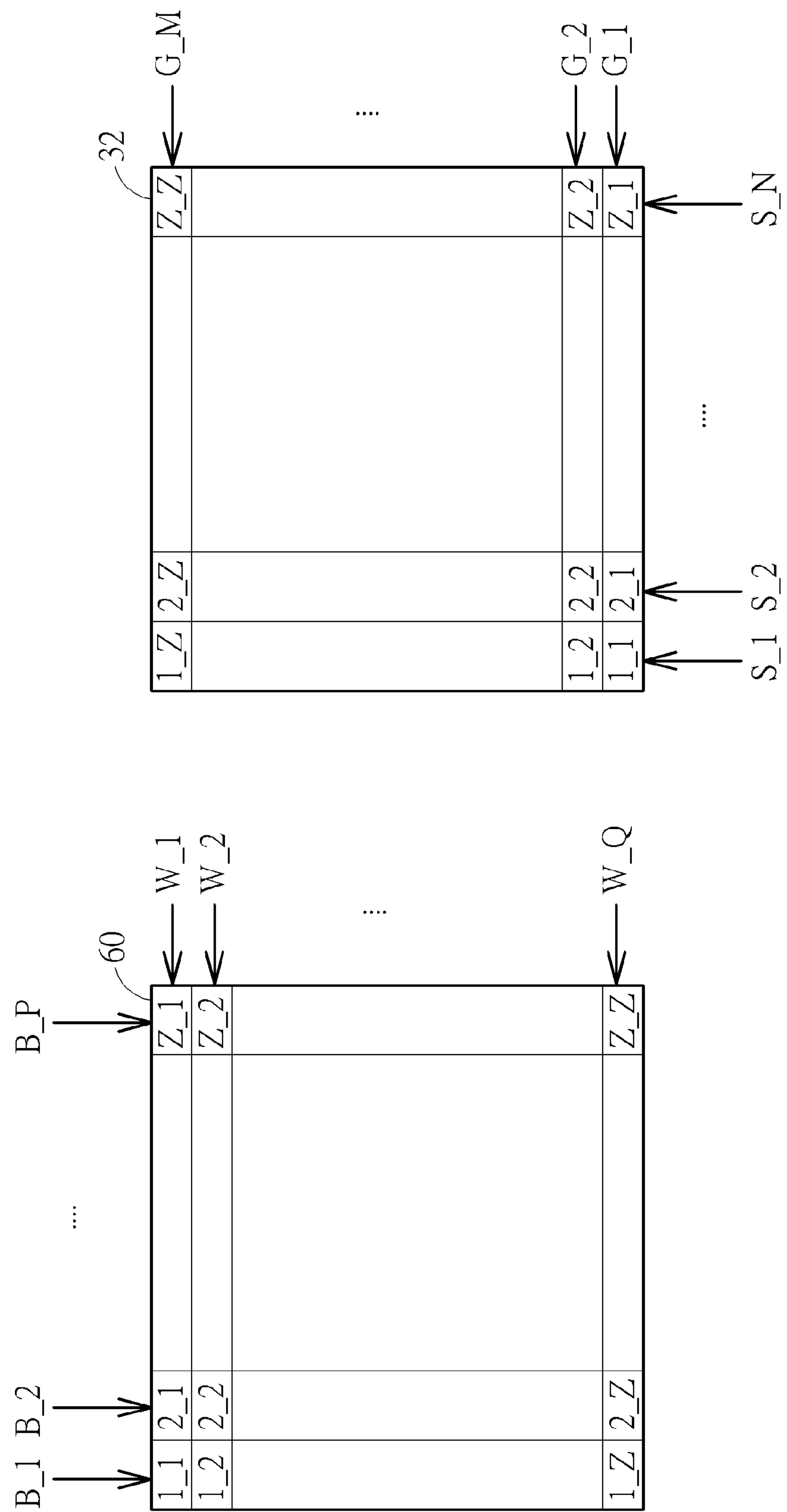
FIG. 6 illustrates a fourth embodiment of the present invention including a memory cell configuration of a memory array and a display cell configuration of the display panel shown in FIG. 3.

Please refer to FIG. 6, which illustrates a fourth embodiment of the present invention including a memory cell configuration of a memory array 60 and the display cell configuration of a display panel 32. In FIG. 6, the memory cells and the display cells for storing and displaying the same image data IMG are denoted with the same symbols, such as 1_1-1_Z, 2_1-2_Z, . . . , and Z_1-Z_Z. From the first to third embodiments, the memory arrays 30, 40 and 50 read the image data IMG of a memory cell corresponding to a word-line in a row of the memory array. In the fourth embodiment, the data driving unit reads the image data IMG of a plurality of memory cells corresponding to a word-line in a row of the memory array. Therefore, the data driving unit 14 is unlimited to read one or more of the memory cells at one time, which allows the memory cells to have various configurations.

The fourth embodiment assumes that the display cells 1_1-Z_1 in a first row of the display panel 32 are mapped to the memory cells 1_1-Z_1 corresponding to a first word-line in first row of the the memory array 60, and so forth, and that the display cells Z_1-Z_Z in a $Z^{th}$ row of the display panel 32 are mapped to the memory cells Z_1-Z_Z corresponding to a $Z^{th}$ word-line in a $Z^{th}$ row of the memory array 60.

When the display panel 32 is to display the image data IMG corresponding to the display cells 1_1-Z_1 in the first row, the logic unit 130 generates the word-line scanning signal W_1 corresponding to the first word-line in the first row and the bit-line scanning signals B_1-B_P corresponding to all of the bit-lines in all columns of the memory array 60 according to the timing signal T_sig. The memory array 60 then turns on the memory cells 1_1-Z_1 corresponding to the first word-line in the first row according to word-line scanning signal W_1, and the memory array 60 reads the image data IMG stored in the memory cell 1_1-Z_1 according to the bit-line scanning signals B_1-B_P to output to the data driving unit 14. Finally, the memory array 60 refreshes the memory cells 1_1-1_Z corresponding to the first word-line in the first row according to the word-line scanning signal W_1, so as to maintain the data stored in the memory cells 1_1-1_1-Z_1.

When the display panel 32 is to display the image data IMG corresponding to the display cell 1_2-Z_2 in the second row, the memory array 30 orderly refreshes the memory cells 1_2-Z_2 corresponding to the second word-line to maintain the data stored in the memory cells 1_2-Z_2. As a result, each of the memory cells 1_1-Z_1 in the first row of the memory array 60 are refreshed one time after the display panel 32 displays the image data IMG corresponding to the display cells 1_1-Z_1 in the first row of the display panel 32. Each of the memory cells 1_1-Z_1, . . . , 1_Z-Z_Z of the memory array 60 is refreshed after the display panel 32 displays the image data IMG corresponding to the each of the display cells in the display panel 32.

Following the timing of the timing signal T_sig, as soon as the data driving unit 14 outputs the data driving signals S_1, S_2, . . . , and S_N, and the scan driving unit 15 outputs one of the scan driving signal G_1, G_2, . . . , or G_M, the logic unit 130 correspondingly generates the word-line scanning signal W_1, W_2, . . . , or W_Q for refreshing the memory cells connected at a same word-line. Alternatively, every time the scan driving unit 15 outputs the scan driving signal G_1, G_2, . . . , and G_M, the memory array 60 performs data refreshing once. Therefore, the memory array 60 of the present invention follows the operation timing of display panel 32 to refresh memory cells immediately after the display panel 32 reads the image data IMG, such that the refresh controller is unnecessary for the memory array 60. This simplifies the circuit design and reduces the cost of the driving circuit 10.

The refresh rate of the memory array 60 may be derived according to the above operations and formulas (1), (2) and (3) and is denoted by the following formula (4):

$$R\_rate=H*P/L \quad (4)$$

Wherein, L is a ratio for indicating a number of the plurality of memory cells read by the memory array 60 atone time from a word-line. In the fourth embodiment, the ratio L is equal to the number M of scan-lines. According to formula (4), the display panel 32 scans H times per second, and the memory array 60 is refreshed P/L times when the display panel 32 scans one time. Therefore, the designer may adjust the ratio L to adjust the refresh rate of the display panel 32, i.e. adjust a number of the plurality of memory cells read by the memory array 60 at one time.

The QVGA display panel having a resolution 240*320 and a refresh rate of 60 Hertzs is taken as an example. The scan-lines number M=320, the refresh rate H=60, the ratio L=3 20 and the ratio K=1 are put into formula (1), (2), (3) and (4). The bit-line number P is 320 and the refresh rate R_rate of the QVGA display panel shown in FIG. 6 is 60*320/320=60 times per second, i.e. per 16.7 millie seconds the QVGA display panel is refreshed once.

Figure 7:
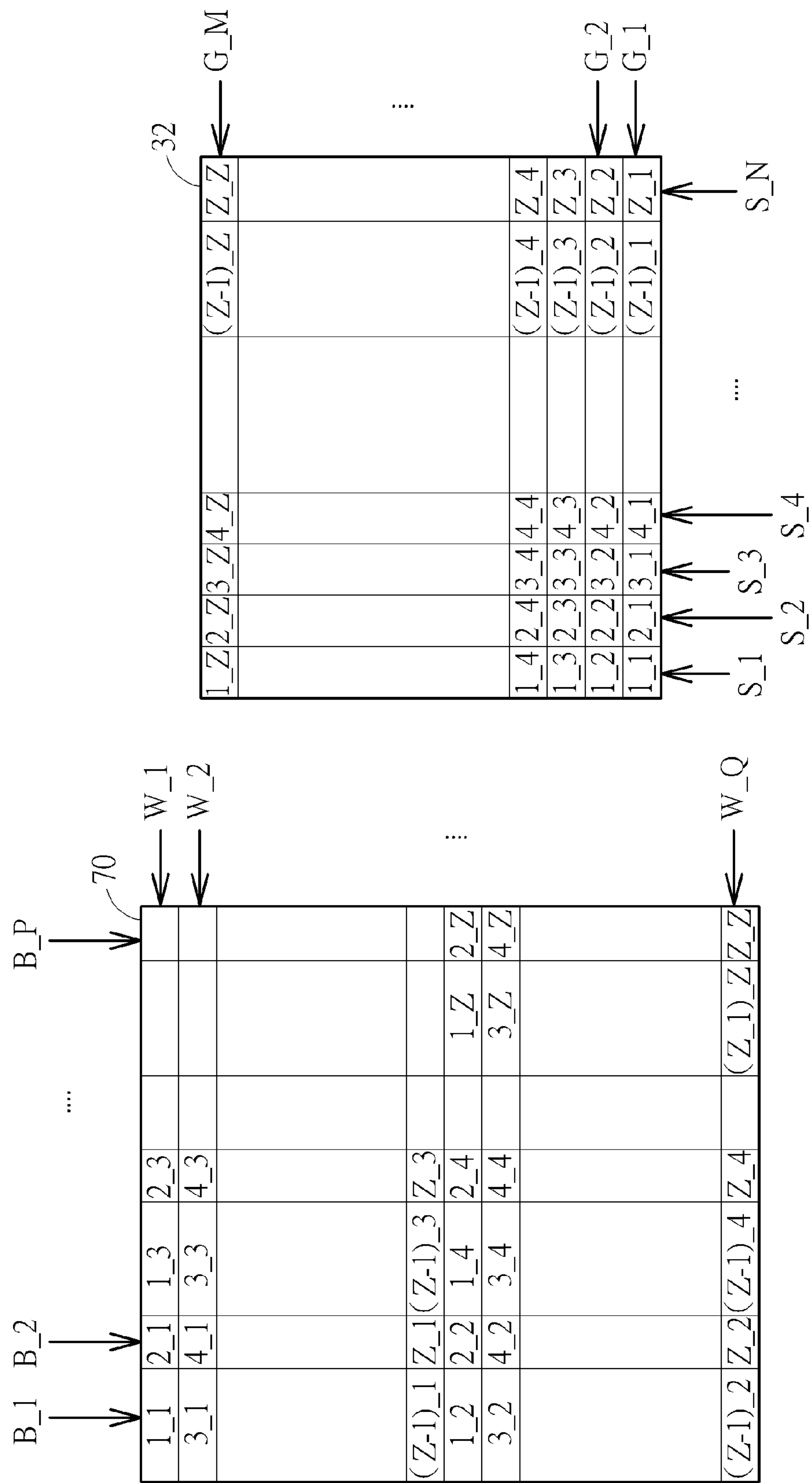
FIG. 7 illustrates a fifth embodiment of the present invention including a memory cell configuration of a memory array and a display cell configuration of the display panel shown in FIG. 3.

Please refer to FIG. 7, which illustrates a fifth embodiment of the present invention including a memory cell configuration of a memory array 70 and the display cell configuration of a display panel 32. In FIG. 7, memory cells and display cells for storing and displaying the same image data IMG are denoted with the same symbols, such as 1_1-1_Z, 2_1-2_Z, . . . , and Z_1-Z_Z.

In the fifth embodiment, the memory array 70 reads two memory cells corresponding to one word-line in one row, i.e. the ratio L=2.

When the display panel 32 is to display the image data IMG corresponding to the display cells 1_1 and 2_1 in the first row, the logic unit 130 generates the bit-line scanning signals B_1 and B_2 corresponding to the bit-lines in the first and second columns and the word-line scanning signal W_1 corresponding to the word-line in the first row according to the timing signal T_sig. Afterwards, the memory array 70 turns on the memory cells 1_1, 2_1, 1_3, 2_3, . . . , etc. corresponding to the first word-line in the first row according to the word-line scanning signal W_1, and the memory array 70 reads the image data IMG stored in the memory cells 1_1 and 2_1 corresponding to the bit-lines in the first and second columns according to the bit-line scanning signals B_1 and B_2 to output to the data driving unit 14. Finally, the memory array 70 refreshes the memory cells corresponding to the first word-line in the first row according to the word-line scanning signal W_1, to maintain the storing data.

Likewise, when the display panel 32 is to display the image data IMG corresponding to the display cells 3_1 and 4_1 in the first row, the memory array 70 orderly refreshes the memory cells 3_1, 4_1, 3_3, 4_3, . . . , etc. corresponding to the word-line in the second row to maintain the storing data. As a result, half of the memory cells in the memory array 70 are refreshed one time after the display panel 32 displays the image data IMG corresponding to the display cells 1_1-Z_1 in the first row of the display panel 32. Each of the memory cells of the memory array 70 are refreshed after the display panel 32 displays the image data IMG corresponding to the display cells 1_1-Z_1 and 1_2-Z_2 in the first and second rows of the display panel 32.

The QVGA display panel having a resolution 240*320 and a refresh rate of 60 Hertzs is taken as an example. The scan-lines number M=320, the refresh rate H=60, the ratio L=2 and the ratio K=1 are put into formula (1), (2), and (3). The bit-line number P is 320 and the refresh rate R_rate of the QVGA display panel shown in FIG. 7 is 60*320/2=9600 times per second, i.e. per 104 microseconds the QVGA display panel is refreshed once.

To sum up, the present invention utilizes the operation of the display panel to synchronously perform the refresh operations of the memory array immediately after the display panel has read and scanned the image data IMG, so as to maintain the data stored in the memory array. The timing controller of the present invention includes the logic unit for generating the bit-line scanning signals and the word-line scanning signals to the memory array according to the timing signal, such that the data driving unit may rewrite the image data into the memory cells of the memory array immediately after the image data IMG is read from the memory array. As a result, and in contrast to a traditional memory array (i.e. the built-in memory) which requires the refresh controller for periodical refresh operations, the present invention may exclude the refresh controller from the driving circuit since the refresh operations for the memory array are performed immediately after the read operations and following a timing based on the timing signal of the timing controller. This simplifies a circuit design of the driving circuit as well as reducing production costs. In addition, a memory cell in a memory array is traditionally turned on twice for respective read and write operations, which leads to higher power consumption of the flat display. The word-line scanning signals of the present invention, however, are outputted once for the read and the following write operations, which saves on power consumption of the flat display.

Those skilled in the art will readily observe that numerous modifications and alterations of the device and method may be made while retaining the teachings of the invention. Accordingly, the above disclosure should be construed as limited only by the metes and bounds of the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit for a display, comprising:

a logic unit for generating a word-line scanning signal corresponding to a word-line; and a memory array coupled to the logic unit for turning on a plurality of memory cells corresponding to the word-line according to the word-line scanning signal to refresh the plurality of memory cells corresponding to the word-line;

wherein the memory array has a first number of bit-lines and a second number of word-lines;

wherein the driving circuit is used for driving a display panel, the display panel has a third number of data-lines and a fourth number of scan-lines, and a product of the first number and the second number is equal to a product of the third number and the fourth number.

2. The driving circuit of claim 1, wherein the logic unit is further used for generating a bit-line scanning signal corresponding to a bit-line of the memory array according to a timing signal, and the memory array is further used for reading an image data stored in a memory cell corresponding to the bit-line and the word-line to output the image data to a data driving unit of the driving circuit.

3. The driving circuit of claim 1, wherein the logic unit is further used for generating a plurality of bit-line scanning signals corresponding to a plurality of bit-lines of the memory array according to a timing signal, and the memory array is further used for reading a plurality of image data stored in a plurality of memory cells corresponding to the plurality of bit-lines and the word-line according to the plurality of bit-line scanning signals; wherein a ratio indicates a number of the plurality of memory cells corresponding to the plurality of bit-lines and the word-line.

4. A display, comprising:

a display panel; and a driving circuit coupled to the display panel for driving the display panel, wherein the driving circuit comprises:

a logic unit for generating a word-line scanning signal corresponding to a word-line; and a memory array coupled to the logic unit for turning on a plurality of memory cells corresponding to the word-line according to the word-line scanning signal to refresh the plurality of memory cells corresponding to the word-line;

wherein the memory array has a first number of bit-lines and a second number of word-lines;

wherein the display panel has a third number of data-lines and a fourth number of scan-lines, and a product of the first number and the second number is equal to a product of the third number and the fourth number.

5. The display of claim 4, wherein the logic unit is further used for generating a bit-line scanning signal corresponding to a bit-line of the memory array according to a timing signal, and the memory array is further used for reading an image data stored in a memory cell corresponding to the bit-line and the word-line to output the image data to a data driving unit of the driving circuit.

6. The display of claim 4, wherein the logic unit is further used for generating a plurality of bit-line scanning signals corresponding to a plurality of bit-lines of the memory array according to a timing signal, and the memory array is further used for reading a plurality of image data stored in a plurality of memory cells corresponding to the plurality of bit-lines and the word-line according to the plurality of bit-line scanning signals; wherein a ratio indicates a number of the plurality of memory cells corresponding to the plurality of bit-lines and the word-line of the memory array.

* * * * *